United States Patent [19]

Lapatovich et al.

[11] 4,436,762
[45] Mar. 13, 1984

[54] LOW PRESSURE PLASMA DISCHARGE FORMATION OF REFRACTORY COATINGS

[75] Inventors: Walter P. Lapatovich, Watertown; Joseph M. Proud, Wellesley Hills; Leslie A. Riseberg, Sudbury, all of Mass.

[73] Assignee: GTE Laboratories Incorporated, Waltham, Mass.

[21] Appl. No.: 402,176

[22] Filed: Jul. 26, 1982

[51] Int. Cl.$^3$ ............................................. B05D 3/06
[52] U.S. Cl. ..................................... 427/39; 427/107; 427/237; 427/238
[58] Field of Search ................... 427/39, 37, 107, 167, 427/38, 237, 238; 204/164

[56] References Cited

U.S. PATENT DOCUMENTS

| | | |
|---|---|---|
| 2,264,892 | 12/1941 | Schaefer . |
| 3,043,983 | 7/1962 | Ray ..................................... 313/221 |
| 3,377,498 | 4/1968 | Koury et al. ......................... 313/221 |
| 3,533,827 | 10/1970 | Rimbach . |
| 3,586,898 | 6/1971 | Speros et al. ....................... 313/229 |
| 3,619,699 | 11/1971 | White .................................. 313/211 |
| 4,048,348 | 9/1977 | Bailey et al. ........................ 427/34 |
| 4,265,950 | 5/1981 | Graff .................................... 428/35 |

OTHER PUBLICATIONS d'Agostino, R. and Flumm, D., *Plasma Etching of Si and $SiO_2$ in $SF_6$-$O_2$ Mixtures*, J. Appl. Phys. 52(1): pp. 162–167, Jan. 1981.

*Primary Examiner*—Evan K. Lawrence
*Attorney, Agent, or Firm*—Ivan L. Ericson

[57] ABSTRACT

A protective refractory metal oxide coating of $3Al_2O_3 \cdot 2SiO_2$ or $3B_2O_3 \cdot 2SiO_2$ is coated on the internal surface of a vessel by low pressure plasma induced chemical reactions. The source of the $SiO_2$ required for the reaction can either be from the internal surface of the vessel (e.g., glass, quartz) or it can be introduced into the vessel.

10 Claims, No Drawings

LOW PRESSURE PLASMA DISCHARGE FORMATION OF REFRACTORY COATINGS

FIELD OF THE INVENTION

This invention relates to refractory coatings in vessels and the like. And, more particularly, it is concerned with the formation of such refractory coatings by plasma induced chemical reactions.

BACKGROUND OF THE INVENTION

Refractory coatings are required in certain illumination sources such as those containing metallic sodium or halogen compounds wherein it is desired to provide an envelope material which is relatively impervious to chemical attack.

Most glasses, containing $SiO_2$, are attacked chemically by sodium, for example, rendering them useless as lamp envelopes. Conventionally, use is made of a ply-glass in which the glass envelope is prepared with a $B_2O_3$-containing glass liner. Such glasses are relatively expensive and may be limited with respect to geometric forms which can be fabricated.

It is known to coat glass envelopes of lamp and cathode ray tubes with various materials which serve as protective coatings for the glass envelopes. U.S. Pat. No. 2,264,892 to Schaefer discloses coating the interior of cathode ray tubes with bentonite ($Al_2O_3.4SiO_2.XH_2O$) as an aqueous suspension. U.S. Pat. No. 3,067,356 to Ray discloses coating a fluorescent lamp envelope with an alkali-free refractory oxide layer of $Al_2O_3$, $TiO_2$, $SiO_2$, or appropriate mixtures thereof using a lacquer vehicle. U.S. Pat. No. 3,533,827 to Rimbach discloses depositing an inorganic binder of $Al_2O_3$ and $B_2O_3$ on a lamp envelope as a liquid coating for adhering a phosphor powder thereto. U.S. Pat. No. 3,586,898 to Speros et al discloses a metal halide high intensity arc discharge lamp utilizing $AlCl_3$ along with mercury to provide a continuous emission spectrum. Speros discloses the need for a high density $Al_2O_3$ envelope or an $Al_2O_3$ coated fused silica envelope to prevent the reaction of the $AlCl_3$ inside the lamp with the $SiO_2$ of the fused silica envelope.

SUMMARY OF THE INVENTION

Protective coatings which are less than impervious from chemical attack and are more costly to implement are some of the problems with the state of the art.

It is an object of the present invention to provide an improved protective coating of a refractory metal oxide on a surface inside a vessel.

In accordance with the present invention, a new and improved coating process for coating surface inside a vessel comprises providing an inert gas, $SiO_2$, and a halide of a metal selected from the group consisting of B, Al, Ga, In, Tl, and combinations thereof, in the vessel. The inert gas is selected from the group consisting of neon argon, helium krypton xenon and combinations thereof. A plasma is generated in the vessel containing the inert gas $SiO_2$ and halide of a metal, to form a refractory metal oxide protective coating, either as a particulate which coats the surface inside the vessel or in situ with the $SiO_2$ contained in the vessel.

In one embodiment the inert gas is neon, the halide is chlorine, the metal is boron, and the refractory metal oxide that is formed is $3B_2O_3.2SiO_2$.

In another embodiment the metal is aluminum, the refractory metal oxide is $3Al_2O_3.2SiO_2$.

In still another embodiment of the invention, the surface contains $SiO_2$.

For a better understanding of the present invention, together with other and further objects, advantages and capabilities thereof, reference is made to the following disclosure and appended claims.

DETAILED DESCRIPTION OF THE PREFERRED EMBODIMENTS

Use of the present invention provides a chemically inert inner coating to lamp envelopes or other surfaces within vessels, resistant to chemical attack, by the formation of a $3B_2O_3.2SiO_2$ or $3Al_2O_3.2SiO_2$ layer in situ with the $SiO_2$ present in the vessel or by the formation of a particulate of $3B_2O_3.2SiO_2$ or $3Al_2O_3.2SiO_2$ when $SiO_2$ is introduced as a particulate. Such a layer is rapidly formed by developing the low pressure plasma discharge in a vapor containing $BX_3$ or $AlX_3$ (X=halogen) with $SiO_2$ present. A pre-discharge step can be added to the processing of vessels (e.g., lamps) and can be followed by simple procedures for the removal of volatile materials prior to filling of the vessel or use of the vessel. Both electroded and electrodeless (e.g., RF discharge) lamps can be prepared in this manner.

In the formation of the refractory metal oxide protective coating a chemical reaction occurs. This chemical reaction can be enhanced with respect to reaction rate when the reactants are brought together at elevated temperature. In many cases the reaction rates are such that excessive temperatures or reaction times are required to produce desired products. However, the gas phase reaction may process at modest gas temperature with rapid rates in low pressure discharge plasmas. Such plasmas are characterized by relatively high electron temperature compared to gas temperature.

In one example, the rapid chemical reaction:

$$12AlCl_3 + 13SiO_2 \rightarrow 2\{3Al_2O_3.2SiO_2\} + 9SiCl_4 \qquad (1)$$

was observed when $AlCl_3$ and an inert gas (e.g., Ne) were placed in a fused silica, $SiO_2$, discharge vessel and a discharge plasma was excited therein. In the example, approximately 3 mg of $AlCl_3$ and Ne buffer gas at 2 torr were placed in a cylindrical fused silica vessel, 1 cm in height and 1 cm in diameter. The vessel was placed between two external electrodes driven by a source of microwaves at 915 MHz, the source adjusted to deliver about 40 W to the discharge plasma contained in the vessel. Typically, the vessel was maintained at a temperature near 100° C. The luminous output of the discharge plasma was observed with sufficient spectral resolution to identify excited species in the plasma. Following discharge, the vapor products of the reaction were observed mass spectrographically with residual gas analysis apparatus, and solids remaining on the inner surface of the vessel were identified by electron microprobe measurements.

The results showed conclusively that $SiCl_4$ was produced in the reaction and that a surface layer of $3Al_2O_3.2SiO_2$ formed on the inner wall of the discharge vessel. $SiCl_4$ is a highly volatile liquid having a vapor pressure of approximately 200 torr at room temperature (20° C.). $3Al_2O_3.2SiO_2$ is a highly refractory material with a melting point of 1800° C.

A parallel theoretical investigation was carried out with a computer program to predict the products of the reaction through chemical equilibrium thermodynamic analysis. The results of this analysis concurred with the experimental findings. Taken together, theory and experiment support the direction and product of reactions as stated in the balanced chemical formulation (1).

The optical spectroscopic observations of the discharge provide information concerning likely steps in the reactions which yield the observed products in the absence of high gas temperature. For example, the discharge spectra show radiation from excited states of the molecules $AlCl_3$, $AlCl_2$, and $AlCl$ in addition to emission from excited atomic Al. Plasma reactions which can account for these species include the dissociative attachment reactions:

$$AlCl_3 + e^- \rightarrow AlCl_2^* + Cl^-$$

$$AlCl_2 + e^- \rightarrow AlCl^* + Cl^-$$

$$AlCl + e^- \rightarrow Al^* + Cl^-$$

$$AlCl_2 + e^- \rightarrow Al^* + Cl_2^- \qquad (2)$$

where energetic electron ($e^-$) collisions dissociate the molecule into an excited product (e.g., $AlCl_2^*$) and a $Cl^-$ ion, which may recombine with neutral Cl (from eq. 3 following) to form molecular ions, $Cl_2^-$.

Electron collisions with the buffer gas, neon, argon, helium, xenon or krypton, preferably Ne, will produce excited states (Ne*) which can produce excitation exchange with concomitant dissociation similar to those depicted in (2):

$$AlCl_3 + Ne^* \rightarrow AlCl_2^* + Ne + Cl$$

$$AlCl_2 + Ne^* \rightarrow AlCl^* + Ne + Cl$$

$$AlCl + Ne^* \rightarrow Al^* + Ne + Cl$$

$$AlCl_2 + Ne^* \rightarrow Al^* + Ne + Cl_2 \qquad (3)$$

Additional reactions may occur in which the reactants may be predisposed in excited states, or in which the products may be produced in various combinations of excited states. However, the possible reactions illustrated by (2) and (3) are sufficient to explain the observed spectra, and are consistent with the observed high reaction rates brought about by energetic electrons in the plasma discharge. Reactions according to (2) and (3) result in the formation of atomic Al and molecular $Cl_2$ gas. The diffusion of these species to the walls of the fused silica ($SiO_2$) vessel results in the further chemical reaction:

$$12Al + 18Cl_2 + 13SiO_2 \rightarrow 2\{3Al_2O_3.2SiO_2\} + 9SiCl_4 \qquad (4)$$

which is equivalent to the overall reaction described by (1).

The significance of these findings lies in the rapid formation of useful materials such as $3Al_2O_3.2SiO_2$ and $SiCl_4$ by means of plasma discharge at relatively low gas temperature and pressure. The refractory material $3Al_2O_3.2SiO_2$ is formed as a coating on the inner surface of the $SiO_2$ vessel, and may be useful as a protective coating when the vessel is subsequently used to contain additional reactive chemical species. The volatile material $SiCl_4$ is useful as a means for transporting Si into the gaseous phase at modest temperatures.

In the example, the vessel was quartz and the $SiO_2$ was derived from the surface of the vessel. However, the vessel is not limited to quartz, and the $SiO_2$ may be introduced into the vessel in any convenient form.

Analogous reactions are to be anticipated with other metal halide compounds exemplified above by $AlCl_3$. Thus, if M represents a Group IIIA metal and X represents a halogen, the general reactions:

$$12MX_3 + 13SiO_2 \rightarrow 2\{3M_2O_3.2SiO_2\} + 9SiX_4 \qquad (5)$$

can be expected. The metal M is typified by boron or aluminum while the halogen X may be chosen from group VIIA (F, Cl, Br, or I).

While there has been shown and described what is at present considered the preferred embodiment of the invention, it will be obvious to those skilled in the art that various changes and modifications may be made therein without departing from the scope of the invention as defined by the appended claims.

What is claimed is:

1. A coating process for coating a surface inside a vessel comprising
   providing a vessel having contents comprising an inert gas, and reactants, said reactants consisting essentially of $SiO_2$ and a halide of a metal selected from the group consisting of B, Al, Ga, In, Tl, and combinations thereof; and
   generating a plasma within said vessel containing said inert gas, and said reactants, to form a refractory metal oxide protective coating on a surface inside the vessel.

2. A coating process according to claim 1 wherein said inert gas is selected from the group consisting of neon, argon, helium, krypton, xenon, and combinations thereof.

3. A coating process according to claim 1 wherein said halide is chlorine.

4. A coating process according to claim 1 wherein said metal is boron.

5. A coating process according to claim 1 wherein said metal is aluminum.

6. A coating process according to claim 1 wherein said refractory metal oxide is $3Al_2O_3.2SiO_2$.

7. A coating process according to claim 1 wherein said surface contains $SiO_2$.

8. A coating process according to claim 1 wherein said $SiO_2$ is introduced into said vessel.

9. A coating process according to claim 1 wherein said surface is an internal surface of said vessel.

10. A coating process for coating a surface inside a vessel comprising
    providing a vessel having contents comprising an inert gas, and reactants, said reactants consisting essentially of $SiO_2$ and a halide of boron; and
    generating a plasma within said vessel containing said inert gas, and said reactants to form a $3B_2O_3.2SiO_2$ protective coating on a surface inside the vessel.

* * * * *